United States Patent [19]

Wei et al.

[11] Patent Number: 5,747,363

[45] Date of Patent: May 5, 1998

[54] METHOD OF MANUFACTURING AN INTEGRATED ELECTRO-OPTICAL PACKAGE

[75] Inventors: Chengping Wei, Gilbert; Song Q. Shi, Phoenix, both of Ariz.; Hsing-Chung Lee, Calabasas, Calif.

[73] Assignee: Motorola, Inc., Schaumburg, Ill.

[21] Appl. No.: 889,724

[22] Filed: Jul. 8, 1997

Related U.S. Application Data

[62] Division of Ser. No. 660,829, Jun. 10, 1996, Pat. No. 5,703,394.

[51] Int. Cl.$^6$ .................................................. H01L 21/20
[52] U.S. Cl. ................................. 438/5; 438/41; 438/45; 438/163
[58] Field of Search .......................... 438/5, 6, 7, 10, 438/16, 22, 23, 26, 27, 29, 45, 41, 163, 303

[56] References Cited

U.S. PATENT DOCUMENTS 5,607,876  3/1997  Biegelsen et al. ................. 438/45
5,620,905  4/1997  Konuma et al. .................... 438/163
5,646,064  7/1997  Gaumont-Guarin et al. ........ 438/41

Primary Examiner—Carl W. Whitehead
Attorney, Agent, or Firm—Eugene A. Parsons

[57] ABSTRACT

An integrated electro-optical package including a plurality of organic light emitting devices (LEDs) directly interconnected to external driver circuits utilizing a printed circuit board, having formed therein a plurality of plated through-hole vias and a method of fabricating the integrated electro-optical package. The organic LEDs are fabricated on a supporting substrate and include vertical interconnections to driver and control circuits mounted on an uppermost surface of a printed circuit board (PCB). The vertical interconnections are formed utilizing plated through-hole conductive vias formed in the printed circuit board, conductive leads, and conductive epoxy. A hermetic seal is formed by positioning a sealing ring formed on the printed circuit board in sealing contact with a sealing area on the surface of the substrate so as to hermetically seal the organic light emitting devices.

13 Claims, 2 Drawing Sheets

METHOD OF MANUFACTURING AN INTEGRATED ELECTRO-OPTICAL PACKAGE

This is a division of application Ser. No. 08/660,829, filed Jun. 10, 1996, U.S. Pat. No. 5,703,394.

FIELD OF THE INVENTION

The present invention pertains to integrated electro-optical packages and more specifically to integrated electro-optical packages incorporating organic devices.

BACKGROUND OF THE INVENTION

Generally, a two-dimensional organic LED array for image manifestation apparatus applications is composed of a plurality of organic LEDs (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. The electrodes of the LEDs are connected to form a two-dimensional X-Y addressing pattern. In practice, the X-Y addressing pattern is achieved by patterning the light transmissive electrodes in an X direction and patterning the metallic electrodes in a Y direction (or vice versa if desired), with the X and Y directions being perpendicular to each other. The patterning of the electrodes is usually accomplished by either shadow mask or etching techniques. Due to the technical limits of shadow masks, etching processes are generally being utilized for high density information displays, which have pixel pitches less then 0.1 mm.

Electroluminescent organic devices formed in the above manner, and especially organic light emitting devices (LEDs) and the like, generally utilize edge interconnection as the accepted method for connecting the light emitting device to external circuits. This type of interconnection generally uses flexible cables extending from electrode lines located about an exterior edge of the substrate to a standard printed circuit board. Due to this edge connection, the display module foot print is rather large and only allows, at most, for a dual scan driving scheme. To achieve a higher contrast ratio with passive drivers, multiscan driving schemes are needed.

Additionally, in general electroluminescent organic devices utilize a layer of low work function metal in the cathode to ensure efficient electron injecting electrodes and low operating voltages. However, the low work function metals are reactive and susceptible to oxygen and moisture, and oxidation of the metal limits the lifetime of the devices. A hermetic or pseudo-hermetic seal is normally required to achieve long term stability and longevity. Several types of hermetic seals are utilized, the most common of which are inorganic materials, such as metals and the like.

A problem that occurs in the fabrication and passivation of electroluminescent organic devices is a result of the fact that the organic layers of the electroluminescent organic devices can not withstand very high temperatures (i.e. generally greater than approximately 300° C.). In many instances, even approaching the critical temperatures of the organic layers, especially if the elevated temperatures are maintained for relatively long periods of time, can degrade the materials used and reduce the reliability and/or the longevity of the resulting devices.

Several types of hermetic and pseudo-hermetic seals are presently utilized, the most common of which are metal cans. However, metal cans are very expensive to fabricate and require extensive labor to assemble. Further, metal cans are large and heavy so that they severely limit the applications of electroluminescent organic devices by increasing the thickness and size of the device itself.

A more recent means of hermetically sealing electroluminescent organic devices is to overcoat them with an inorganic material, such as a dielectric or metal, to achieve a hermetic seal. However, the electroluminescent organic devices are very susceptible to the high temperatures normally required during deposition of dielectrics and metals. Thus, the ceramic or metal material generally must be deposited by PECVD methods in order to meet the low temperature criteria. The major problem with this method of sealing is that during the PECVD deposition there is a strong possibility of radiation damage to the electroluminescent organic device.

At the present time there exist a need to devise a relatively inexpensive and convenient integrated electro-optical package, or light emitting device display module, and method of fabrication that provides for direct interconnection of an electroluminescent organic device with external driver and control circuits, thus allowing for multiscan driving schemes and thereby decreasing the size and thickness of the device as well as providing for hermetic sealing of the electroluminescent organic devices.

Accordingly, it would be highly advantageous to provide a new integrated electro-optical package, or light emitting device display module, and method of manufacturing which overcame these problems.

It is a purpose of the present invention to provide for a new and improved integrated electro-optical package and method of fabrication that is smaller and thinner in dimensional size than current packages, or display modules, utilizing organic devices.

It is another purpose of the present invention to provide for an integrated electro-optical package with organic LEDs which is not limited in size by the electrical connections.

It is a purpose of the present invention to provide for a new and improved integrated electro-optical package and method of fabrication that includes the direct interconnection of the organic light emitting devices with external drive circuits.

It is yet another purpose of the present invention to provide for an integrated electro-optical package containing arrays of organic LEDs which are hermetically sealed from ambient conditions.

It is another purpose of the present invention to provide for a new and improved integrated electro-optical package and method of fabrication in which a direct interconnection of the organic device and a printed circuit board serves to encapsulate the organic materials.

It is a further purpose of the present invention to provide methods of fabricating an integrated electro-optical package incorporating organic LEDs which does not damage the LEDs during fabrication.

It is a still further purpose of the present invention to provide a new and improved method of fabricating an integrated electro-optical package utilizing an organic device which is relatively convenient and inexpensive to manufacture.

SUMMARY OF THE INVENTION

The above problems and others are at least partially solved and the above purposes and others are realized in an integrated electro-optical package, or light emitting device display module, that includes a plurality of organic light emitting devices (LEDs) directly interconnected to external driver circuits utilizing a printed circuit board, having formed therein a plurality of plated through-hole vias and a method of fabricating the integrated electro-optical package.

The organic LEDs of the present invention are fabricated on a supporting substrate that includes a plurality of parallel, laterally spaced apart, optically transparent, electrically conductive strips positioned on a surface of the supporting substrate so as to define a plurality of first electrodes. Electroluminescent media are positioned on each of the plurality of first electrodes so as to define a light emitting diode in conjunction with an associated first electrode of each of the plurality of electrodes. A layer of metal is positioned over the electroluminescent medium so as to define a plurality of parallel, laterally spaced apart, metallic strips orthogonal to the plurality of transparent conductive strips. The laterally spaced apart, metallic strips define a second electrode for each of the light emitting diodes. Each electrically conductive strip of the plurality of electrically conductive strips, forming the plurality of first electrodes, and each metallic strip of the plurality of metallic strips, forming the plurality of second electrodes, has an end in electrical contact with a plated through-hole conductive via and conductive leads, formed in a multi-layer printed circuit board, electrically interfaced utilizing conductive epoxy. A hermetic seal is formed by positioning a sealing ring formed on the printed circuit board in sealing contact with a sealing area on the surface of the substrate of the organic device so as to hermetically seal the organic light emitting devices utilizing a sealant material, such as an epoxy adhesive.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DESCRIPTION OF THE PREFERRED EMBODIMENTS

Figure 1:
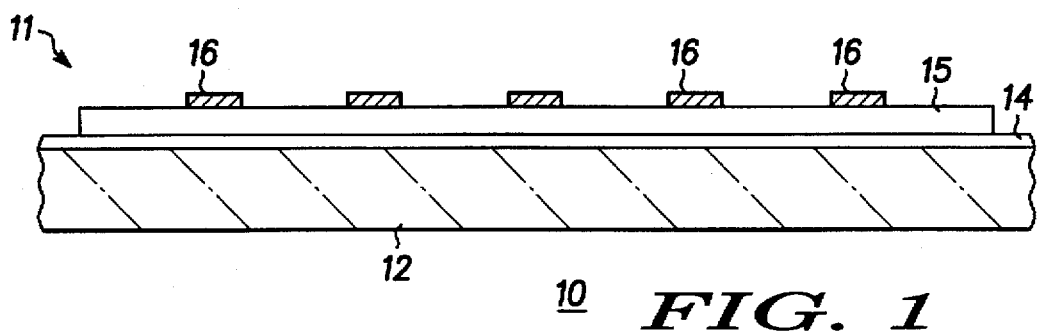
FIG. 1 is a simplified cross-sectional view of an organic light emitting device illustrating the structure in accordance with the present invention.
Figure 2:
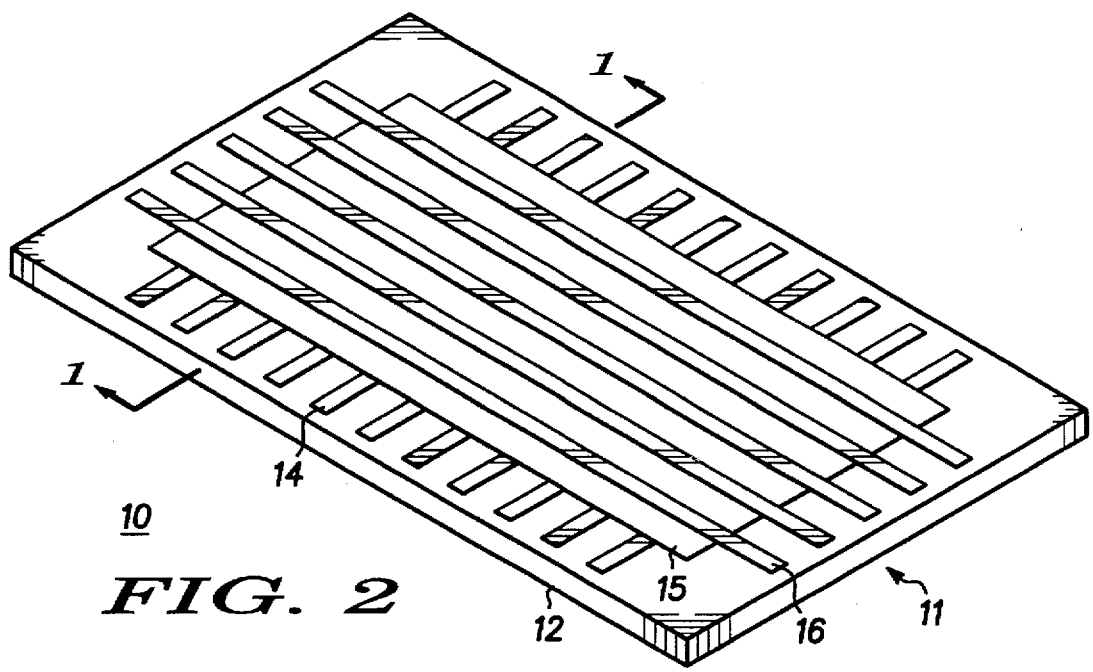
FIG. 2 is a perspective view of an organic light emitting device according to the present invention, prior to interconnection and encapsulation with a printed circuit board.

Referring to the drawings, wherein like characters indicate like parts throughout the figures, FIG. 1 is a simplified cross-sectional view of a partial array 11 of an organic light emitting device 10 according to the present invention. FIG. 2 is a perspective view of a supporting substrate having formed thereon the array 11 of light emitting devices, thereby forming the light emitting device 10 of the integrated electro-optical package of the present invention.

Referring specifically to FIG. 1, illustrated is a substrate 12, of the organic light emitting device 10, as seen along line 1—1 of FIG. 2, portions being broken away so that only a portion of substrate 12 can be seen. Substrate 12, in this specific embodiment, is some optically clear material, such as glass, quartz, a transparent semiconductor material or the like, etc. The array 11 of pixels of organic light emitting devices (LEDs) is positioned on substrate 12, generally by fabricating array 11 directly on substrate 12 in any of the various methods of fabricating electroluminescent organic LEDs. As a specific example, array 11 includes a transparent layer of conductive material, such as indium-tin-oxide (ITO) or the like, with an active organic media, such as an organic electroluminescent media, positioned thereon and a cathode formed of a metal layer including a thin layer of a low work function metal, thereby defining a plurality of patterned electrodes (discussed presently).

More specifically, a plurality of parallel, laterally spaced apart, optically transparent, electrically conductive strips 14 are formed on the surface of substrate 12. Generally, strips 14 are formed by depositing a layer of material and etching the layer to form strips 14 or by masking and performing metal lift-off techniques well known in the art. In a specific embodiment, substrate 12 is made of glass or polymeric materials and has deposited thereon a layer of light transmissive, electrically conductive material, which is selected from a variety of organic or inorganic conductors, such as conductive polyaniline (PANI), or indium-tin-oxide (ITO). The layer is then patterned by conventional lithography techniques to form the plurality of parallel conductive strips 14 that are capable of being addressed in a column fashion and will serve as an anodic electrode in the final array 11.

On the top of conductive strips 14 is deposited a continuous layer or organic material, more specifically a layer of organic electroluminescent medium 15, which generally consists of a layer of hole transporting material, a layer of active emitter material, and a layer of electron transporting material. It will of course be understood by those skilled in the art that in some applications either or both of the layers of hole transporting material and electron transporting material can be eliminated, in most instances with a result of somewhat poorer operation.

On top of the layer of electroluminescent medium 15 is deposited a layer of low work function metal or a metal alloy, capped with a thick layer of stable metal such as aluminum, silver, copper or gold. The layer of stable metal is selected to form a good electrical contact with the layer of low work function metal, thereby forming the cathode electrode for LED array 11, more specifically a plurality of metallized strips 16. The patterning of the cathode of electrodes, or metallized strips 16, is achieved by either shadow mask techniques or a shadow wall techniques, generally known by those skilled in the art. Generally, any metals with a work function less than approximately 4.0 eV can be used as the cathode material, e.g. lithium, magnesium, indium, calcium, etc.

The materials used in the layer of organic electroluminescent medium 15 in the two-dimensional array 11 of this invention can include any of the materials of organic EL devices disclosed in the prior art. As stated above, the layer of organic electroluminescent medium 15 generally consists of a layer of hole transporting material, a layer of active emitter material, and a layer of electron transporting material. Polymers, organic molecules and organometallic complexes can be used as hole transporting materials, active emitters and electron transporting materials. In the active emitter layer, fluorescent dopants used for enhancement of the device efficiency, as well as achievement of different colors, can also be incorporated.

The layer of organic electroluminescent medium 15 can be deposited by vacuum evaporation. The layer of organic electroluminescent medium 15 can also be deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

In this simplified embodiment, each LED forms a pixel and by addressing specific LEDs by row and column in a well known manner, the specific LEDs are energized to produce an image which is transmitted downwardly through substrate 12.

It will be understood by those skilled in the art that LED array 11 and substrate 12 are greatly enlarged in the FIGS. The actual size of substrate 12 is on the order of a few milli-meters (2 mm to 10 mm) along each side with each LED being on the order of 5 to 50 microns on a side (or in diameter if the LED is round). Because of the extremely small size of substrate 12, conductive strips 14 and metallized strips 16 have a very small cross-section, which severely limits their current carrying capacity, or current density.

In one typical operation, the image is formed by sequentially turning on the rows of pixels and supplying video data to the columns. In this scheme only one row at a time is addressed or "turned ON". Thus, the conductive strips 14 for each row need to carry only sufficient current for one LED (the one LED in the row which is ON). However, all of the LEDs in the ON row could potentially be turned ON simultaneously. Thus, the metallized strips 16 for the ON row, which can potentially be required to carry current for however many LEDs are in the row (e.g. 100 to 1500 LEDs), must carry many times as much current as the column metal traces.

Generally, the material forming conductive strips 14 will be less conductive than, for example, metallized strips 16. This is because the material must be not only electrically conductive but it must be optically transmissive, or substantially transparent (conduct at least 80% of the light generated in array 11). To offset this difference in conduction, conductive strips 14 are used as column conductors and metallized strips 16 are used as row conductors.

Figure 3:
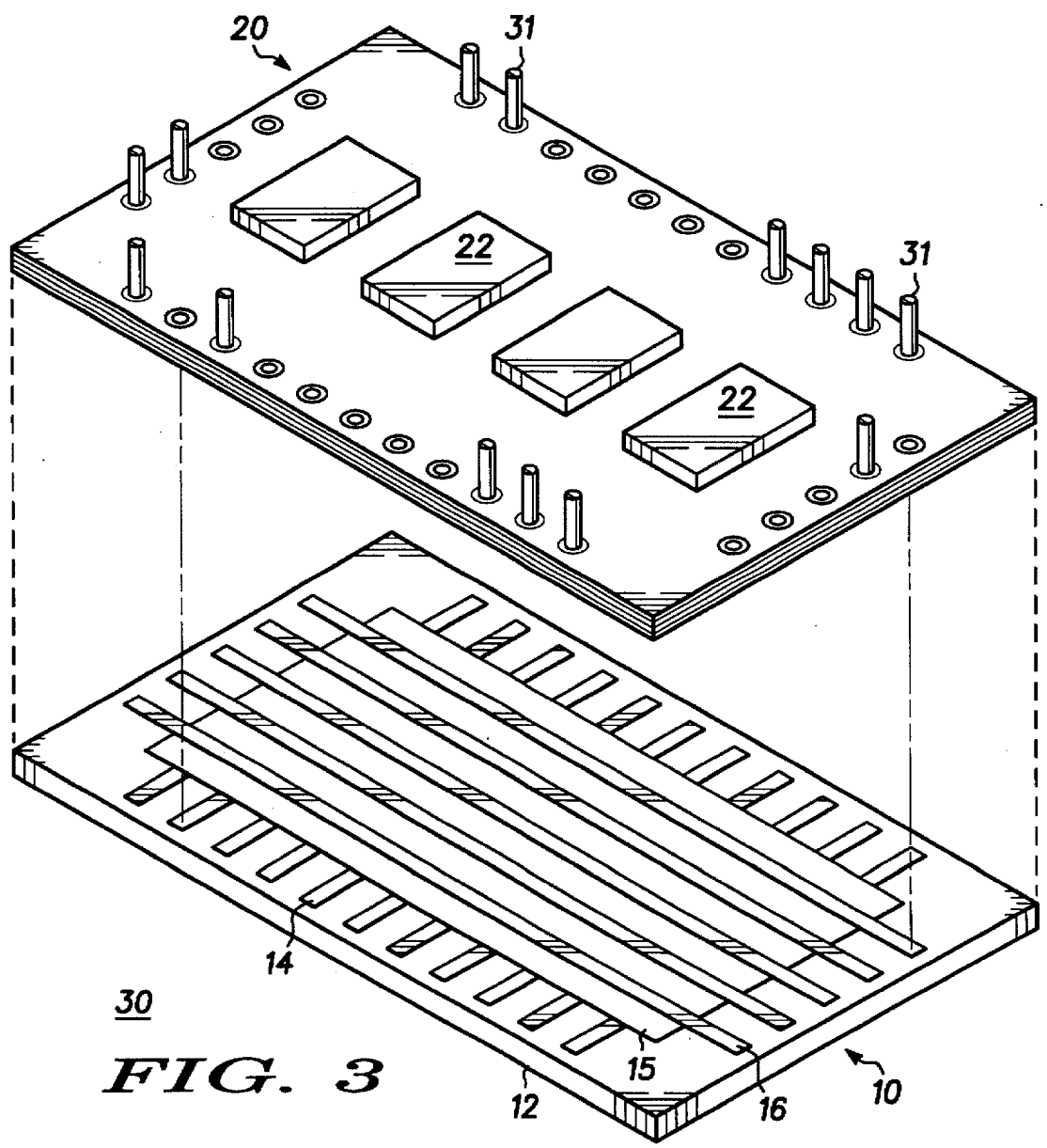
FIG. 3 is an exploded perspective view of an integrated electro-optical package in accordance with the present invention.
Figure 4:
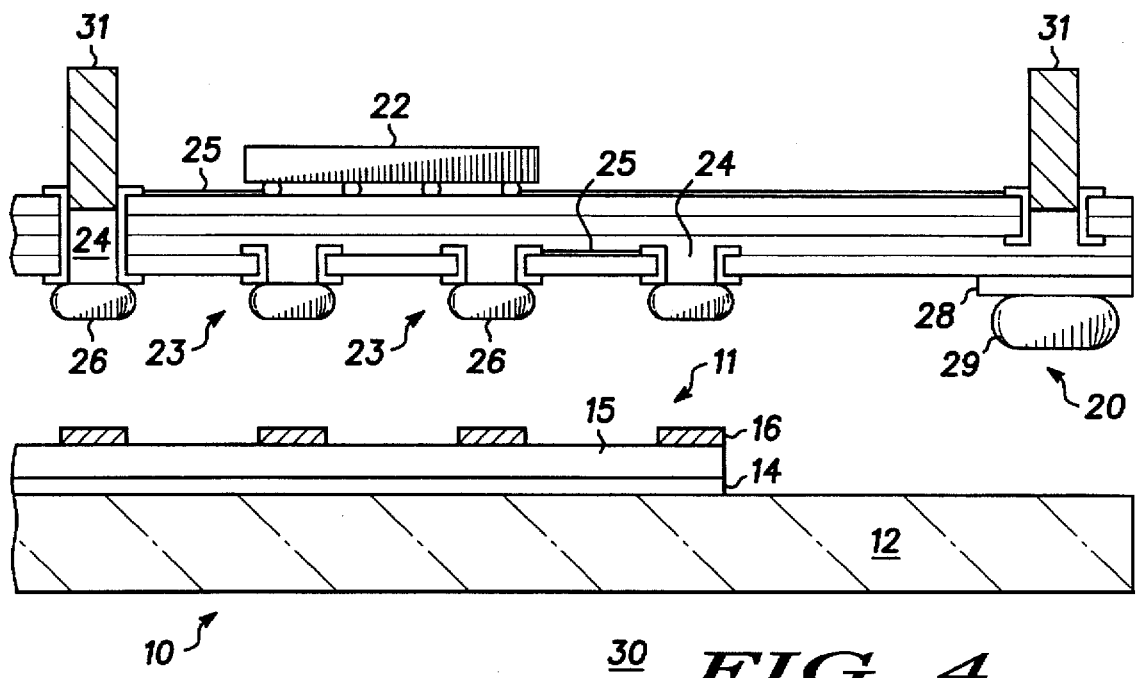
FIG. 4 is cross-sectional view of an embodiment of an organic integrated electro-optical package in accordance with the present invention.

Referring now to FIG. 3, illustrated is an exploded view in perspective showing the relative positions of components of an integrated electro-optical package 30. An enlarged view, portions thereof broken away, of the components of FIG. 3 assembled into a complete integrated electro-optical package 30 is illustrated in FIG. 4. Generally, integrated electro-optical package 30 is composed of two primary components, organic light emitting device 10 and a multilayer printed circuit board (PCB) 20 having formed thereon driver electronics. Multilayer printed circuit board 20 is fabricated according to techniques well known to those skilled in the art, and in general is composed of sandwiched layers of standard FR4 board and circuit routing layers. A plurality of driver and control circuits 22 generally are formed as semiconductor chips and are wire bonded or bump bonded to electrical contacts on the upper major surface 21 of PCB 20. Generally, driver and control circuits 22 making up the driver electronics can be mounted on PCB 20 at any convenient time subsequent to the formation of PCB 20. During assembly of integrated electro-optical package 30, electrically conductive strips 14 and metallized strips 16 of light emitting device 10 are connected to the plurality of row and column drivers and control circuits 22 through a plurality of vertical interconnections 23, utilizing electrical leads, or traces, 25, plated through-hole vias 24 formed in PCB 20, and conductive epoxy 26. It will be understood that a good electrical interface between light emitting device 10 and PCB 20 and driver and control circuits 22 is achieved through the use of conductive epoxy 26 which can be formed as bumps (as illustrated in FIG. 4), or alternatively as a layer of conductive material, such as z-axis conductive epoxy. These vertical interconnections 23 allow for a multiscan driving scheme, thus a higher contrast display ratio, without requiring any additional active area for electrical connections. In addition, there is provided an electrical interface to external electronics, such as a plurality of I/O pins 31, or the like.

As previously stated, array 11 of organic LEDs, and especially the layer of low work function metal, is susceptible to oxygen and moisture in the surrounding atmosphere and must, therefore, be hermetically sealed to provide reliability and a reasonable longevity. Accordingly, a sealing ring 28 of dielectric material, is formed on a lower surface of PCB 20. During assembly, a hermetic seal is formed between PCB 20 and light emitting device 10 by using a sealant material 29 to attach sealing ring 28 to a sealant area formed about the perimeter of light emitting device 10. Sealing epoxy, or the like, is used as sealant material 29. Thus, PCB 20 serves to encapsulate the array 11 of organic light emitting devices and no further encapsulation element, such as a metal can, etc., is required. This utilization of PCB 20, as the encapsulating element, results in a compact organic integrated electro-optical package 30 that is easier to manufacture than prior art methods and devices.

Thus, an improved integrated electro-optical package, or light emitting device display module, is disclosed which is hermetically sealed and incorporates organic type LEDs as the light source. Disclosed are improved interconnects and package structures capable of multiscan driving schemes to produce higher contrast ratios utilizing organic LEDs. This improved package structure and fabrication techniques substantially reduces the limitation on size of the packages in that vertical interconnects are achieved through a printed circuit board which also serves as an encapsulation element. The array of LEDs is hermetically sealed from ambient moisture and the environment and there is little or no damage to the organic LEDs, thus greatly improving reliability, as well as being small and compact.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an integrated electro-optical package comprising the steps of:

providing an organic device on a supporting substrate defining a plurality of pixels;

providing a printed circuit board containing thereon at least one driver and control circuit and having formed therein a plurality of plated through hole vias;

interconnecting the printed circuit board to the organic device with a conductive epoxy, thereby electrically interfacing the plurality of pixels of the organic device with the at least one driver and control circuit; and hermetically sealing the printed circuit board to the supporting substrate with a sealant material.

2. A method of fabricating an integrated electro-optical package as claimed in claim 1 wherein the plurality of pixels of the organic device are defined by a plurality of patterned electrodes.

3. A method of fabricating an integrated electro-optical package as claimed in claim 2 wherein the plurality of patterned electrodes include a first layer of patterned indium tin oxide (ITO) and a second layer of one of a patterned low work function metal and a patterned metal alloy, capped with a stable metal, aligned orthogonal to the first layer.

4. A method of fabricating an integrated electro-optical package as claimed in claim 1 wherein the conductive epoxy is formed in bumps.

5. A method of fabricating an integrated electro-optical package as claimed in claim 1 wherein the conductive epoxy includes a continuous layer of z-axis epoxy.

6. A method of fabricating an integrated electro-optical package comprising the steps of:

providing a supporting substrate;

patterning a first layer of conductive material on the supporting substrate, thereby defining a plurality of electrically conductive strips;

positioning a continuous layer of organic material overlying the first layer of conductive material;

patterning a second layer of conductive material orthogonal to the first layer of conductive material and overlying the continuous layer of organic material, thereby defining a plurality of metallized strips and a plurality of pixels of an organic light emitting device;

positioning a printed circuit board to overly the second layer of conductive material, having contained thereon at least one driver and control circuit and having formed therein a plurality of plated through hole vias;

positioning a conductive epoxy to electrically interconnect the plurality of pixels defined by the first layer of conductive material and the second layer of conductive material with the at least one driver and control circuit; and sealing the organic light emitting device to the printed circuit board.

7. A method of fabricating an integrated electro-optical package as claimed in claim 6 wherein the plurality of electrically conductive strips are formed of indium-tin-oxide (ITO).

8. A method of fabricating an integrated electro-optical package as claimed in claim 7 wherein the plurality of metallized strips are formed of one of a low work function metal and a metal alloy, capped with a stable metal.

9. A method of fabricating an integrated electro-optical package as claimed in claim 6 wherein the continuous layer of organic material is comprised of a layer of hole transporting material, a layer of active emitter material, and a layer of electron transporting material.

10. A method of fabricating an integrated electro-optical package as claimed in claim 6 wherein the printed circuit board is a multi-layer printed circuit containing alternating layers of FR4 board and circuit routing layers.

11. A method of fabricating an integrated electro-optical package as claimed in claim 6 wherein the plurality of plated through hole vias serve as a plurality of vertical interconnections to electrically interface an end of each of the plurality of electrically conductive strips and an end of each of the plurality of metallized strips to the at least one driver and control circuit, thereby providing for a multiscan driving scheme.

12. A method of fabricating an integrated electro-optical package as claimed in claim 6 wherein the conductive epoxy is formed in bumps.

13. A method of fabricating an integrated electro-optical package as claimed in claim 6 wherein the conductive epoxy includes a layer of z-axis conductive epoxy.

* * * * *